United States Patent
Koizumi

(10) Patent No.: US 6,756,617 B2
(45) Date of Patent: Jun. 29, 2004

(54) IMAGE SENSING APPARATUS AND READING APPARATUS

(75) Inventor: Kazuhisa Koizumi, Ibaraki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/263,012

(22) Filed: Oct. 2, 2002

(65) Prior Publication Data

US 2003/0067006 A1 Apr. 10, 2003

(30) Foreign Application Priority Data

Oct. 5, 2001 (JP) ........................................ 2001-310199

(51) Int. Cl.$^7$ .............................................. H01L 31/062
(52) U.S. Cl. ........................ 257/292; 257/184; 257/187; 257/203; 257/291; 257/461; 257/462; 257/929
(58) Field of Search ................................ 257/184, 187, 257/221, 203, 291, 292, 433, 461, 462

(56) References Cited

U.S. PATENT DOCUMENTS 6,037,643 A * 3/2000 Knee ........................... 257/443
6,587,186 B2 * 7/2003 Bamji et al. ................ 356/5.01

FOREIGN PATENT DOCUMENTS

| JP | A 4-068571 | 3/1992 |
| JP | A 5-014598 | 1/1993 |

* cited by examiner

*Primary Examiner*—Long Pham
*Assistant Examiner*—Wai-Sing Louie
(74) *Attorney, Agent, or Firm*—Morgan & Finnegan, LLP

(57) ABSTRACT

It is an object of the present invention to provide wiring pattern conditions for obtaining a high-quality analog image output signal in a contact image sensor which operates at a high speed (5 MHz or more). In order to achieve this object, a CIS substrate has the following arrangement. Signal lines φM, φRS, and φTR which transmit signals to CCD chips (2—2) are digital signal lines Dn, and signal lines from the CCD chips (2—2) to the inputs of emitter followers and output lines from the emitter followers are analog signal lines An. In FIG. 1, letting A1 be an analog signal line from the CCD, and D1 be a digital signal line, the analog signal line A1 and digital signal line D1 are formed on separate layers.

8 Claims, 8 Drawing Sheets

WAVEFORM OF SIGNAL OS1
500mV / div

WAVEFORM OF SIGNAL OS2
500mV / div

40ns / div

WAVEFORM OF SIGNAL OS1
500mV / div

WAVEFORM OF SIGNAL OS2
500mV / div

40ns / div

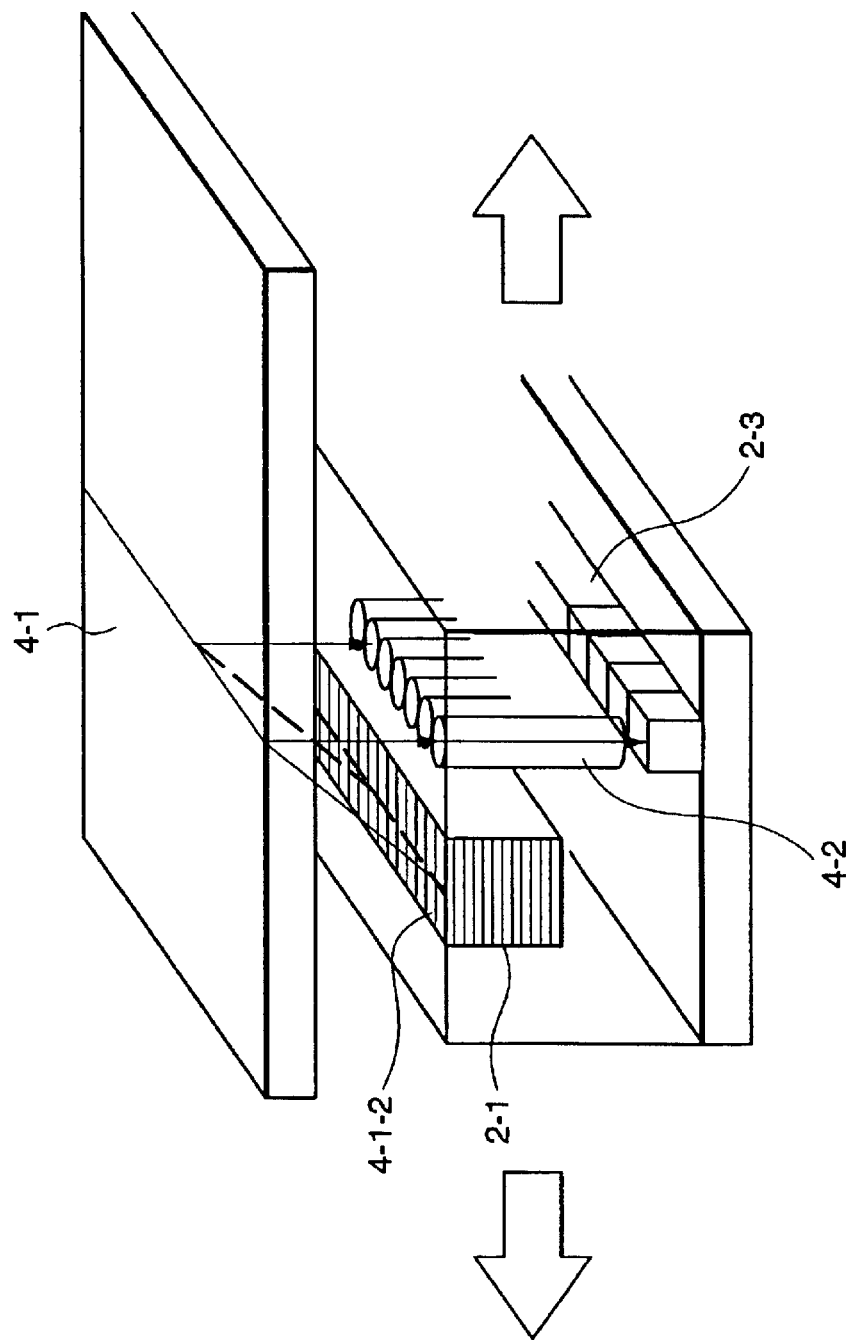

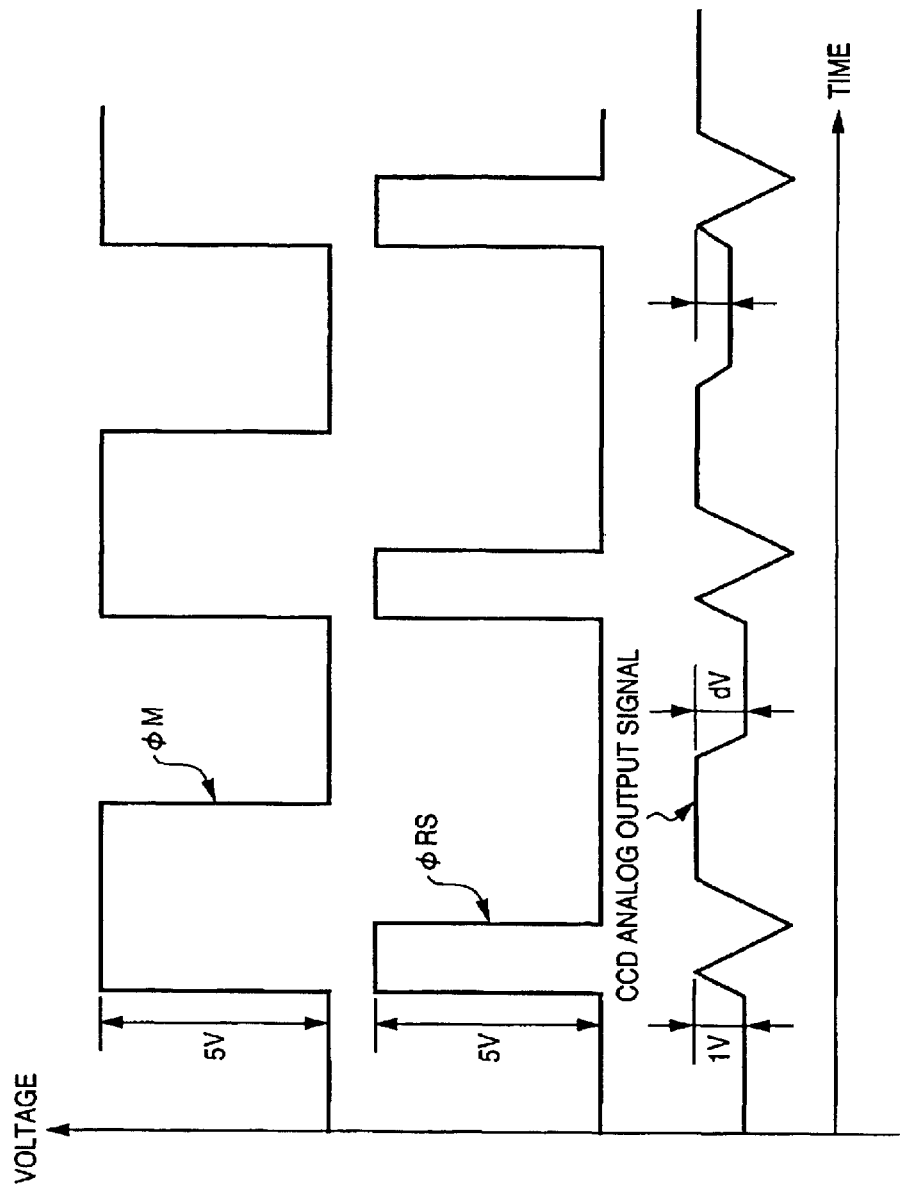

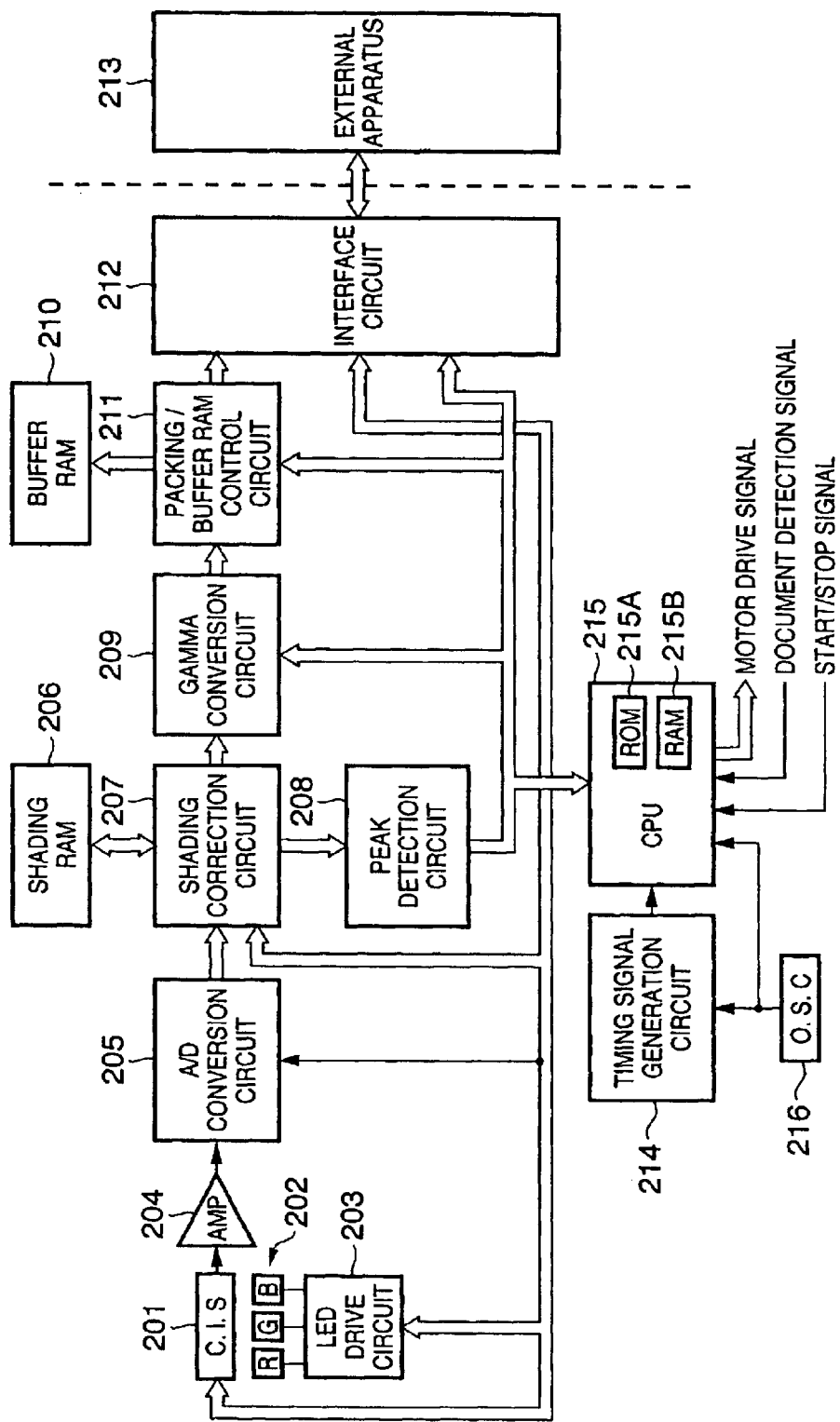

IMAGE SENSING APPARATUS AND READING APPARATUS

FIELD OF THE INVENTION

The present invention relates to an image sensing apparatus and reading apparatus and, more particularly, to the wiring structure of a contact image sensor which operates at a high speed (5 MHz or more).

BACKGROUND OF THE INVENTION

In a contact image sensor (to be referred to as a CIS hereinafter), a reduction in size and power consumption can be attained depending on its structure. However, a CIS requires enough photoelectric conversion chips (to be referred to as CCD chips hereinafter) for the size of an image to be read and has a large number of CCD chips arranged in a line. In addition, an image signal as an analog signal has a range of 1 V with respect to the voltage of a driving signal (generally 5-V logic) due to a reduction in voltage of a photoelectric conversion chip. For this reason, to represent a monochrome image with 8-bit 256 grayscale levels, a precision as high as 1 LSB=about 4 mV is required. Therefore, it is hard to drive a conventional CIS at a high speed, and the driving frequency of a CCD chip is generally 1 to 2 MHz.

Demands for improvement in performance (demands for high resolution and high-speed reading) of an image reading apparatus have now arisen, and improvement in resolution of a CCD chip (600 dpi or more) and high-speed driving (5 MHz or more) has also been demanded for a CIS. Additionally, a method of improving actual reading speed by outputting a plurality of analog signals so as to realize higher speed (10 MHz or more) is expected to become the mainstream. Under the circumstances, the influence of logic signal noise on an analog signal cannot be neglected.

Moreover, in many cases, a CIS structurally employs an LED as a light source for reading, and chips themselves and their driving wiring lines are generally formed on a single substrate. At this time, driving control of an LED light source is performed by a combination of driving current and lighting time modulation (PWM control). The driving current is mostly larger than (twice or more) the CCD driving current, and switching noise which may occur in PWM driving would affect a CCD analog output signal.

In the prior art, to increase the S/N ratio of an analog signal from a CCD chip, techniques that pertain to the electrode arrangement of a switching element, the wiring structure accompanying the arrangement, and the like are suggested (see Japanese Patent Laid-Open Nos. 4-68571 and 5-14598).

However, in order to realize higher resolution and higher-speed operation of a CCD, a reduction in crosstalk of a plurality of stage outputs and prevention of superposition of digital noise on an analog signal are necessary. For this reason, it is very difficult to design a CIS substrate by conventional wiring techniques.

SUMMARY OF THE INVENTION

The present invention has been made to solve the above problem, and has as its object to provide an image sensing apparatus and, more specifically, an image sensing apparatus which, in a contact image sensor operating at a high speed (5 MHz or more), can prevent noise of a digital signal for light source driving and photoelectric conversion driving from being superposed on an analog signal, establish wiring pattern conditions suitable for reducing crosstalk between signals and suppressing variation in signal level, and output desirable image signals, and reliable reading apparatus including the same.

In order to solve the above problem, according to the present invention, there is provided an image sensing apparatus comprising a multi-layered substrate in which a photoelectric conversion chip and a wiring pattern of a digital signal which drives the photoelectric conversion chip are wired on a single substrate layer, wherein a wiring pattern of an analog signal which includes image information output from the photoelectric conversion chip and the wiring pattern of the digital signal which drives the photoelectric conversion chip are formed on separate substrate layers.

According to another aspect of the present invention, there is provided an image sensing apparatus comprising a multi-layered substrate in which a photoelectric conversion chip and a wiring pattern of a digital signal which drives the photoelectric conversion chip are wired on a single substrate layer, wherein a wiring pattern of an analog signal which includes image information output from the photoelectric conversion chip and the wiring pattern of the digital signal which drives the photoelectric conversion chip are formed on separate substrate layers so as not to vertically contact each other.

According to still another aspect of the present invention, there is provided an image sensing apparatus comprising a multi-layered substrate in which a photoelectric conversion chip and a wiring pattern of a digital signal which drives the photoelectric conversion chip are wired on a single substrate layer, wherein a width of a wiring pattern of an analog signal which includes image information output from the photoelectric conversion chip is equal to or more than a width of the wiring pattern of the digital signal which drives the photoelectric conversion chip.

According to still another aspect of the present invention, there is provided an image sensing apparatus comprising a multi-layered substrate in which a photoelectric conversion chip and a wiring pattern of a digital signal which drives the photoelectric conversion chip are wired on a single substrate layer, wherein a wiring pattern of an analog signal which includes image information output from the photoelectric conversion chip and the wiring pattern of the digital signal which drives the photoelectric conversion chip are wired on a single substrate layer, and a ground width between the wiring patterns is at least equal to or more than a width of the wiring pattern of the digital signal.

According to still another aspect of the present invention, there is provided an image sensing apparatus comprising a multi-layered substrate in which photoelectric conversion chips and a wiring pattern of a digital signal which drives the photoelectric conversion chip are wired on a single substrate layer, the multi-layered substrate having a plurality of analog output signal stages, the number of which is equal to or less than a number of the photoelectric conversion chips and being arranged to output an output signal from the photoelectric conversion chip to an outside of the image sensing apparatus through the plurality of analog output stages, wherein an analog output circuit is provided for each analog output stage, and each analog output circuit is comprised of one element.

According to still another aspect of the present invention, there is provided an image sensing apparatus comprising a multi-layered substrate in which a photoelectric conversion chip, a first wiring pattern of a digital signal which drives the photoelectric conversion chip, and a second wiring pattern of a driving signal which drives an LED light source for reading are wired on a single substrate layer, wherein each of the first wiring pattern and a third wiring pattern of an analog signal which includes image information output from the photoelectric conversion chip is formed to have one or more wiring states out of:

(1) a wiring state in which the first wiring pattern and third wiring pattern are formed on separate layers;

(2) a wiring state in which the first wiring pattern and third wiring pattern are formed on a single layer, and a ground width between the first and third wiring patterns is at least equal to or more than a width of the second wiring pattern; and (3) a wiring state in which a high-frequency removal device is inserted at a ground portion of a driving signal which drives the LED light source, and the second wiring pattern is electrically separated from the first and third wiring patterns.

According to the present invention, there is provided a reading apparatus which reads a document image, comprising the above-described image sensing apparatus, a document convey device disposed before and after the image sensing apparatus to position the document, a contact device which makes the document contact the image sensing device, and a control device which processes an output signal from the image sensing device to perform device control.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 4 is a schematic perspective view showing the structure of a contact image sensor;

FIG. 5 shows timing charts of a CIS;

FIG. 8 is a block diagram showing an electrical arrangement for explaining the control circuit in FIG. 7 in detail.

DETAILED DESCRIPTION OF THE PREFERRED EMBODIMENT

A preferred embodiment according to the present invention will be described below in detail with reference to the accompanying drawings.

1. Overall Arrangement of Contact Image Sensor

The overall arrangement of a contact image sensor for use in the embodiment will be described with reference to FIG. 4.

A line source unit 4-1 comprises an LED light source unit 2-1 arranged at the end of the line source unit 4-1 and a light guide 4-1-2 for uniformly diffusing light to be emitted from the line source unit 4-1 in the reading main scanning direction.

Irradiation light emitted from the light guide 4-1-2 is reflected by a document on a document glass table, and the reflected light passes through a SELFOC lens array 4-2 to form an image on a light-receiving element (CCD) 2–3 fixed on a substrate 4-3.

The formed light image is photoelectrically converted into an electrical signal, which is sequentially output as an image signal.

2. Arrangement of CCD Circuit Board

Figure 2:
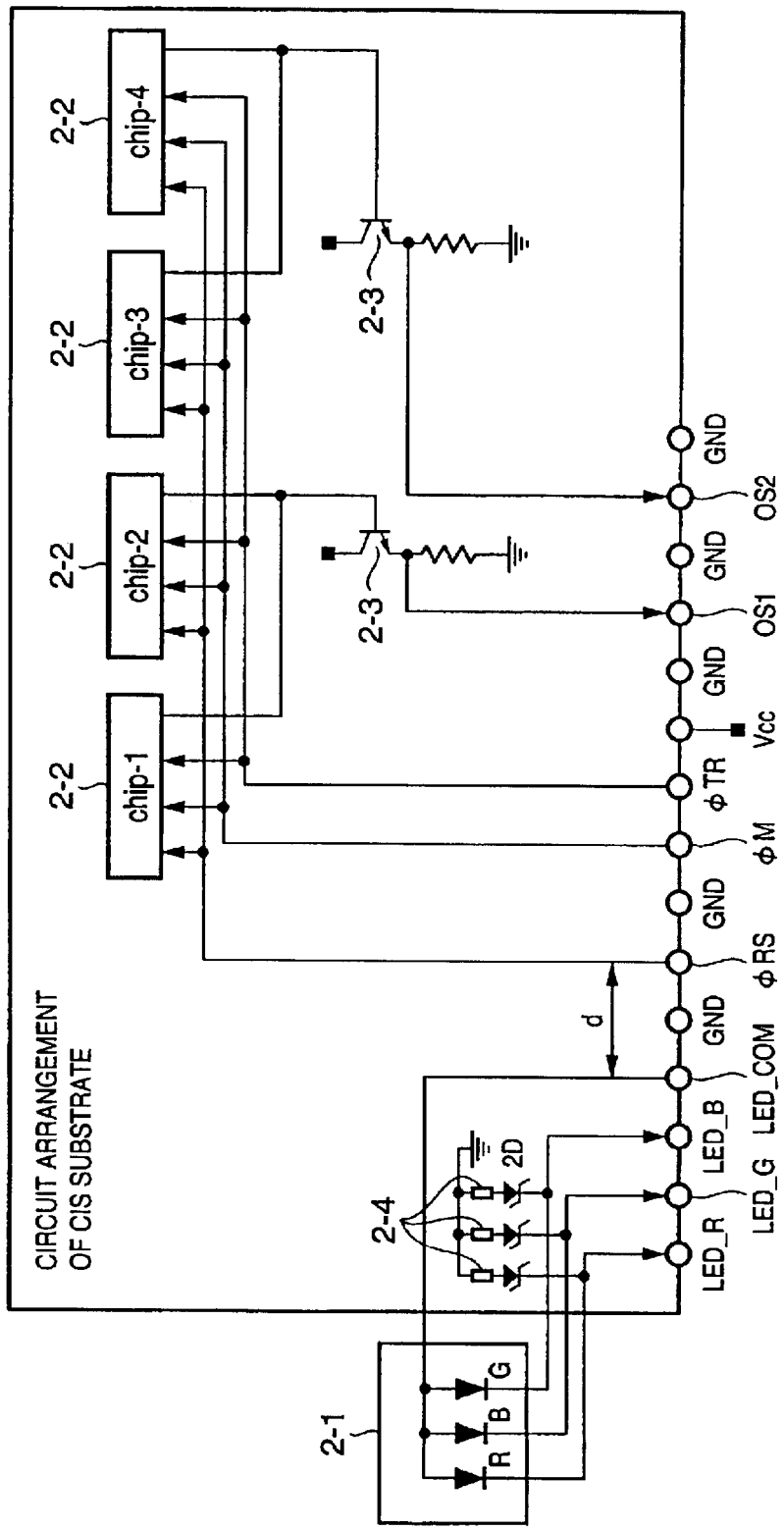
FIG. 2 is a view of the wiring arrangement of a CIS substrate.

FIG. 2 shows a block diagram of the circuit arrangement on a CCD board.

The LED light source unit 2-1 for R, G, and B color components is connected to the CCD board as a light source for reading. Wires for driving the LED light source unit 2-1 are arranged on the CIS substrate. In the embodiment, an end LED light source is employed as the light source for reading. Also, in fact, the LED body is mounted on another board, and only its wires are present on the CIS substrate.

For example, four CCD chips 2—2 are arranged in a line in the reading main scanning direction. Outputs from the chip-1 and chip-2 are represented by OS1 (Output Signal 1), and those from the chip-3 and chip-4, OS2 (Output Signal 2). Signal lines for the respective signals are connected to two emitter follower circuits 2–3 as analog output circuits. The output of each chip is connected to the base of the transistor of a corresponding one of the emitter follower circuits 2–3. Each emitter follower circuit 2–3 switches the chip for outputting signals from one chip to the other, thereby outputting analog image signals for all pixels of the connected chips. Signals respectively output from the emitter follower circuits 2–3 are both analog signals having an amplitude of at most about 1 V, and an amplitude dV of an output signal indicates the quantity of reflected light (equivalent to the document density) (see FIG. 5).

The potential difference of this output analog signal is A/D-converted at a common 8-bit resolution in a subsequent processing circuit.

As signals for driving the chip-1 to chip-4, a pixel clock φM, a clock φRS which resets electric charge of each pixel, and a clock φTR which is a horizontal sync signal in image reading and is a periodic signal corresponding to the storage time of the CCD are supplied. The clocks (φM, φRS, and φTR) are digital signals with an amplitude of 5 V. FIG. 5 shows the timing charts of φM, φRS, and OS.

Referring to FIG. 5, each clock has ground lines arranged on its both sides. This reduces noise and crosstalk contained in the clock in signal transmission and stabilizes ground on the CIS side. Note that the present invention is not limited to the number of chips and that of output lines described above.

3. Wiring Pattern in CIS Substrate According to Present Invention

Figure 1:
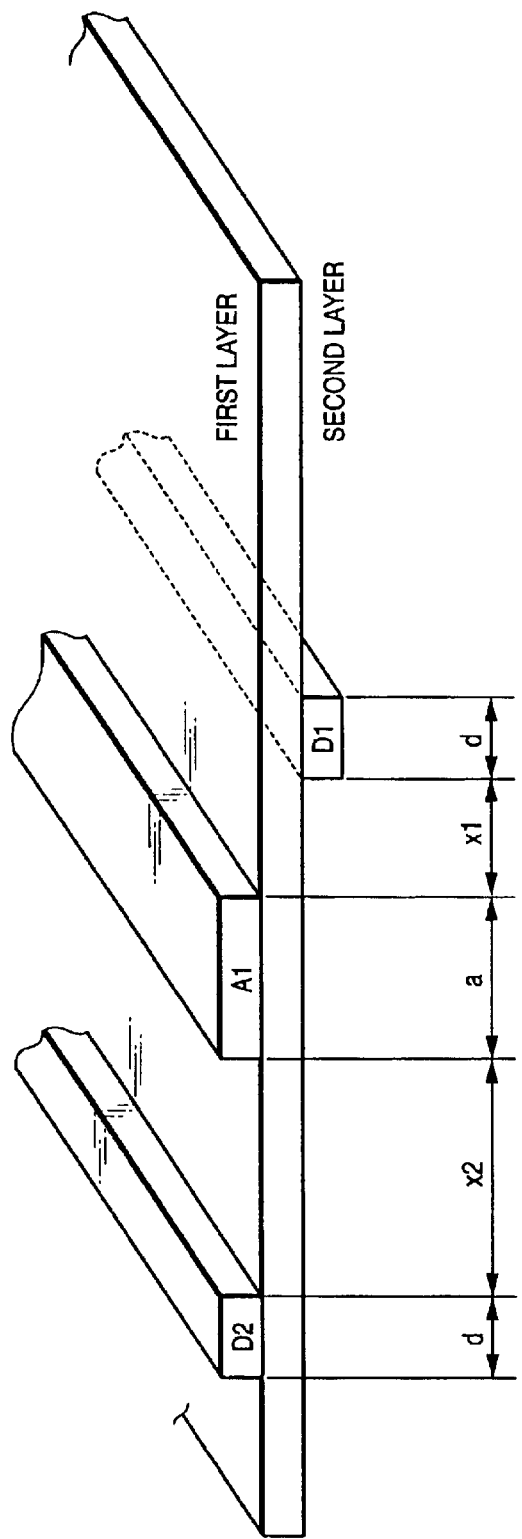
FIG. 1 is a schematic perspective view showing the substrate (CIS substrate) of a contact image sensor having a wiring pattern according to the present invention.

The specific structure of an image sensing apparatus according to the present invention will be described with reference to FIGS. 1 and 2. FIG. 1 is the sectional view of a CIS substrate according to the present invention, and a two-layer plate is used as an illustrative example.

The signal lines φM, φRS, and φTR to the CCD chips 2—2 are digital signal lines Dn, and the signal lines from the CCD chips 2—2 to the input and output lines of the emitter follower circuit 2–3 are analog signal lines An. In FIG. 1, assume that an analog signal line and a digital signal line from the CCD are defined as respectively an analog signal line A1 and a digital signal line D1, and that the analog signal line A1 and digital signal line D1 are separately formed on different layers.

When the signal lines A1 and D1 are to be formed on different layers, the digital signal line D1 is not formed immediately below the analog signal line A1. A distance x1 between the analog signal line A1 and digital signal line D1 is set to be "0" or more, and a ground wiring line is formed in the distance x1.

Realizing the above-described wiring states of the two types of lines can reduce mutual interference (crosstalk) between the patterns of the two types of lines.

Additionally, a pattern width d of the digital signal line D1 and a pattern width a of the analog signal line A1 are set such that a>d holds at any point on the substrate, thereby reducing the transmission impedance of the analog signal line A1 and increasing the resistance of the analog signal line A1 to external noise.

In many cases, a space for the substrate is limited in accordance with a demand for a reduction in size of a CIS, and an analog signal line and a digital signal line may be arranged on a single layer in a certain region. In this case, as shown in FIG. 1, the analog signal line A1 and a digital signal line D2 are arranged such that x2>d holds in any region, where x2 represents the distance between the analog signal line A1 and digital signal line D2.

If LED driving patterns are formed on the same substrate, clock-based lines (both analog and digital lines) and the LED driving lines are separated from each other by the digital pattern width d or more, and each high-frequency removal filter 2–4 (e.g., ferrite bead) is inserted between ground and a corresponding one of the cathodes of Zener diodes connected to the anodes of the LEDs to avoid electrostatic breakdown, as shown in FIG. 2. This prevents the return of a digital signal from entering the LED and inhibits switching noise of the LED from being mixed into an analog signal.

If a frequency higher than the driving frequency of these CCD chips is required as the image reading speed, a plurality of analog signal stages are necessary for outputting analog signals. In this case, as shown in FIG. 2, analog output circuits (emitter follower circuits in FIG. 2) corresponding in number to the number of analog output lines must be provided. At this time, an analog output circuit may be prepared using an IC containing a plurality of elements. However, this arrangement prolongs wiring lines from each chip to the analog output circuit and from the analog output circuit to the outside of the CIS and increases the possibility of crosstalk. For this reason, an analog output circuit is always prepared using an IC containing one element, as shown in FIG. 2, and output signal lines from the analog output circuit are arranged on the basis of the above-described embodiment. This makes it possible to shorten an analog wiring line as much as possible.

Figure 3A:
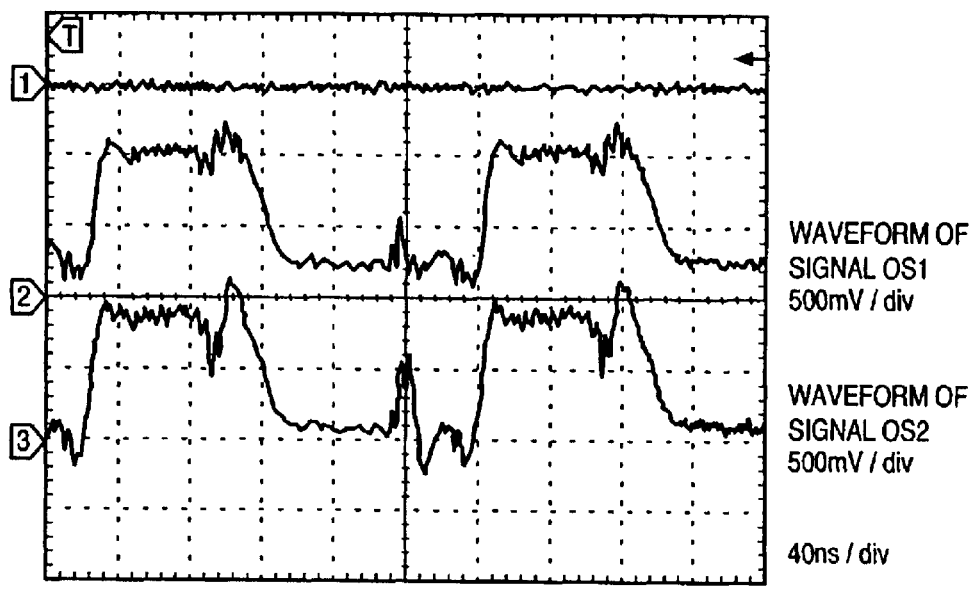
FIGS. 3A and 3B are waveform charts of analog image signals of a contact image sensor.
Figure 3B:
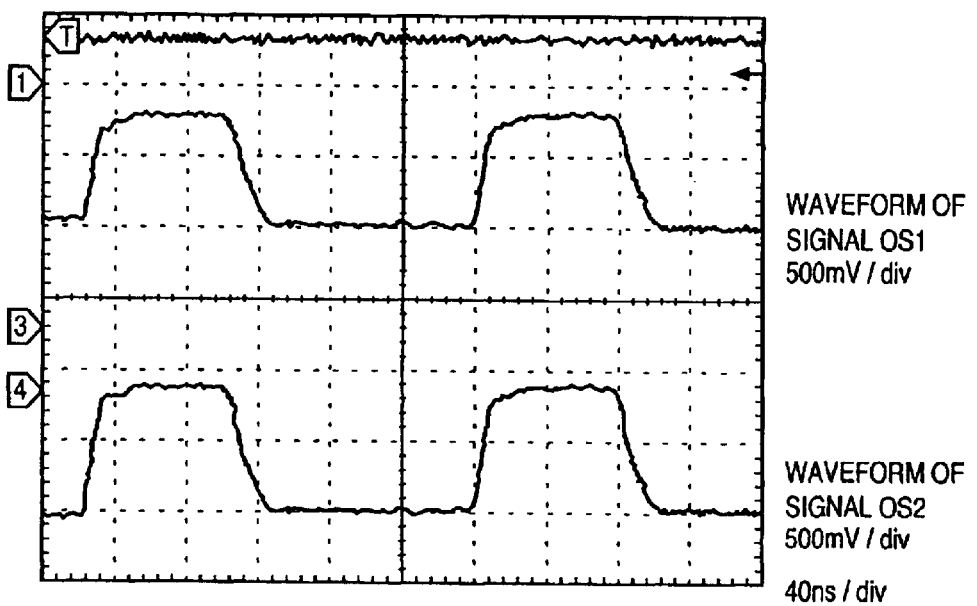

FIGS. 3A and 3B show the measurement data of the output waveforms of analog signals obtained from experiments by the present inventors. The CIS is driven by the driving circuit shown in FIG. 6.

Figure 6:
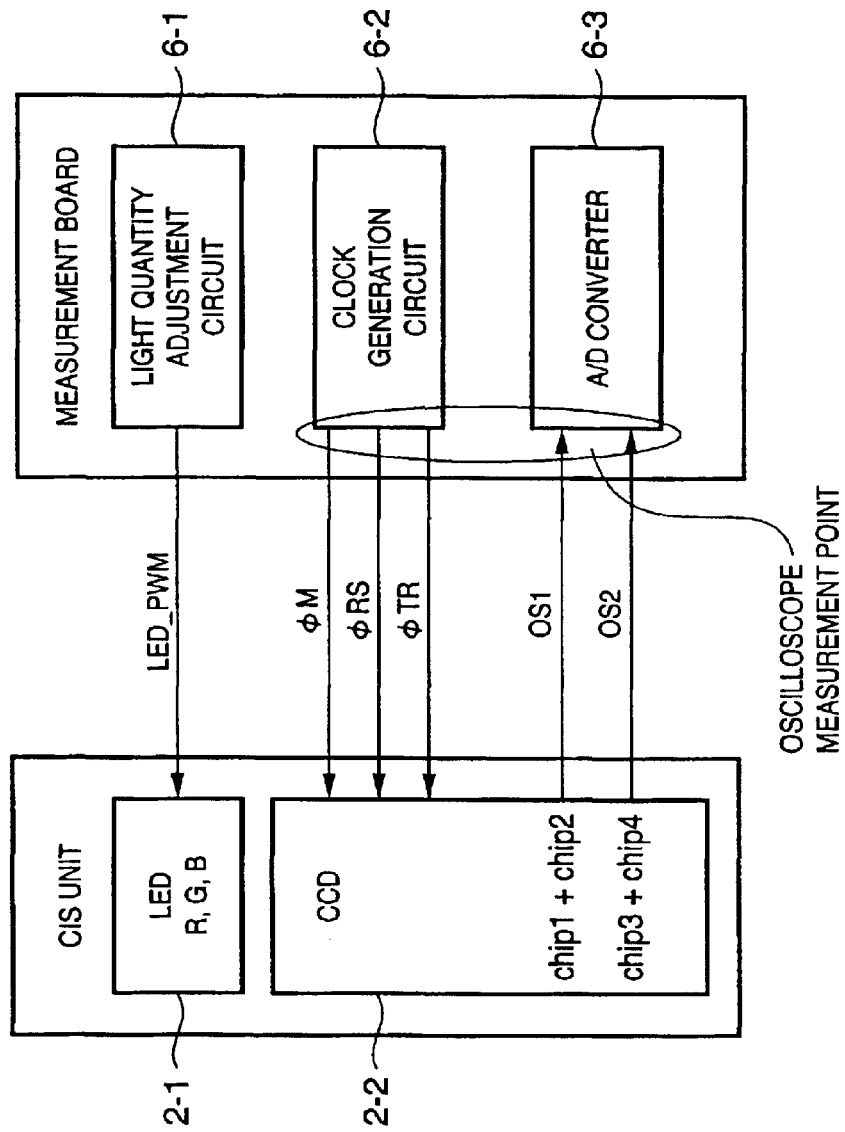
FIG. 6 is a circuit diagram for measuring the waveform of an analog signal.

The CIS unit in FIG. 6 is a sample equivalent to the CIS shown in FIG. 2. On a measurement board, a light quantity adjustment circuit 6-1 for the LED light source, a clock generation circuit 6-2 which generates a clock on the basis of the timing charts shown in FIG. 5, and an A/D converter 6-3 which receives an analog signal from the CCD are arranged. The board and CIS unit are connected to each other by a 400-mm FFC cable. In FIGS. 3A and 3B, measurement is performed under the same conditions, i.e., using the same driving circuit, the same cable, and CCD chips having the same frequency and characteristics. Each waveform is obtained by measurement at a terminal on the measurement board (see FIG. 6).

FIG. 3A shows output waveforms in a CIS to which the present invention is not applied. More specifically, analog signal lines and digital signal lines are formed on the same layer and spaced at the ground distance as defined in claim 4 of the present invention. Referring to FIG. 3A, digital noise is superposed on an analog signal, and level variation occurs due to high-frequency noise. When image reading was experimentally performed in this signal state, images greatly degraded.

On the other hand, FIG. 3B shows a CIS using wiring lines according to the present invention. Not only superposition of digital signal noise is considerably suppressed, but level variation due to high-frequency noise is greatly suppressed. When image reading was performed in this state, images with high tone level reproducibility were obtained.

4. Overall Arrangement of Document Image Reading Apparatus Having Contact Image Sensor According to Present Invention One embodiment using a contact image sensor according to the present invention in a sheet-feed type document image recording apparatus will be described in detail with reference to FIGS. 7 and 8.

Figure 7:
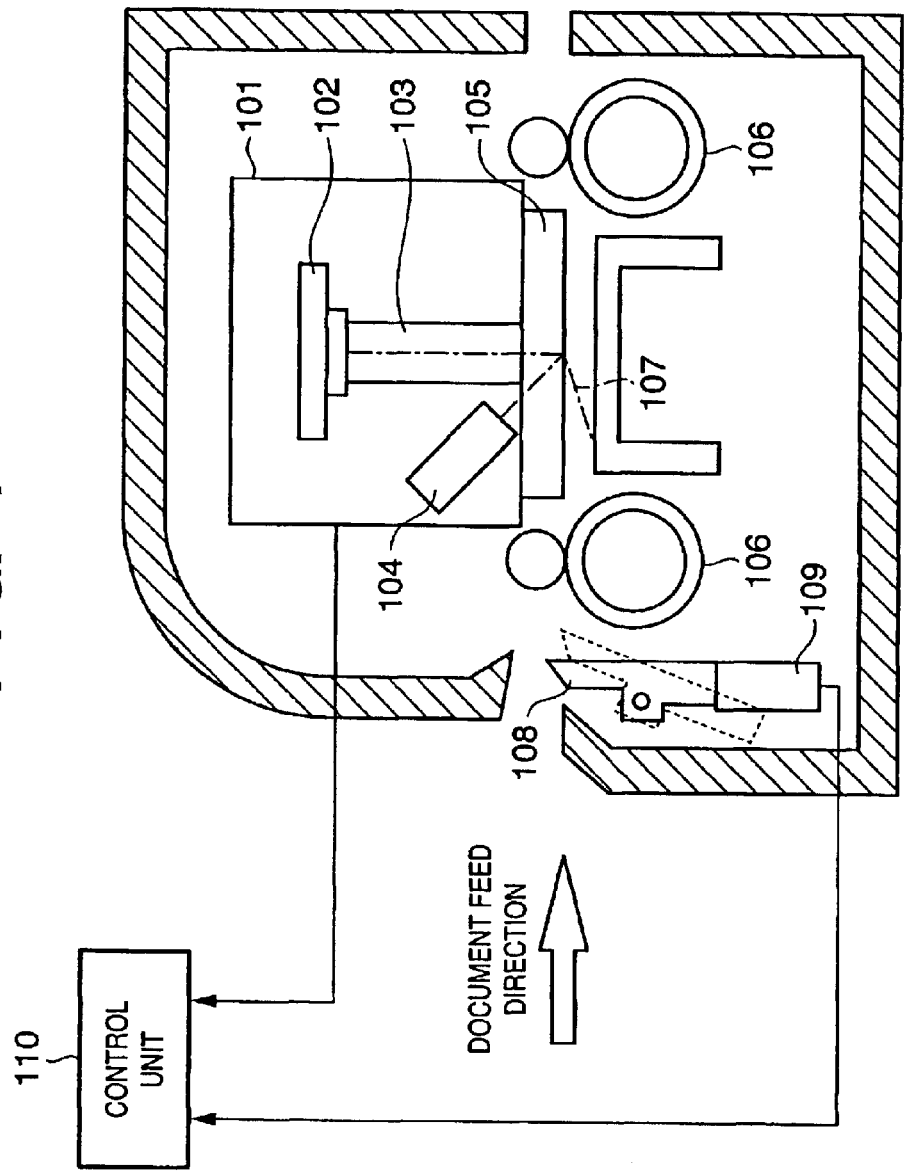
FIG. 7 is a schematic view of the arrangement of a document image reading apparatus according to the present invention.

FIG. 7 is a schematic view of the arrangement of a document image reading apparatus for reading a document image.

A contact image sensor (to be referred to as a "CIS" hereinafter) 101 is comprised of a solid-state image sensing element 102, SELFOC lens 103, LED array 104, and contact glass 105.

Convey rollers 106 are disposed before and after the CIS 101 and used to position a document. A contact sheet 107 is used to make the document contact the CIS 101. A control circuit 110 processes signals from the CIS 101.

A document detection lever 108 is used to detect insertion of a document. When the document detection lever 108 detects that a document is inserted, it tilts, and the output from a document sensor 109 changes in accordance with this tilt. When the CPU 215 in the control circuit 110 is notified of the change in output, it determines that a document is inserted and drives a drive motor (not shown) of the document convey roller 106. With this operation, document feed is initiated to perform reading operation.

FIG. 8 is a block diagram showing the electrical arrangement for explaining the control circuit 110 of FIG. 7 in detail. Its circuit operation will be described below with reference to FIG. 8.

In FIG. 8, reference numeral 201 denotes an image sensor (the CIS 101 in FIG. 7). R, G, and B LEDs 202 are integrally formed. An LED control (drive) circuit 203 turns on the R, G, and B LEDs 202 in turn upon reading each line to illuminate a document while the document is fed over the contact glass 105. With this process, R, G, and B line-sequential color read images can be obtained.

An AMP 204 amplifies a signal output from the CIS 201, and an A/D conversion circuit 205 A/D-converts the amplified output into, e.g., an 8-bit digital output. A shading RAM 206 stores shading correction data obtained by reading a calibration sheet in advance. A shading correction circuit 207 performs shading correction for the read image data on the basis of the data stored in the shading RAM 206. A peak detection circuit 208 detects peak values of the read image data for each line, and is used to detect the leading end of the document.

A gamma conversion circuit 209 performs gamma conversion of the read image data in accordance with a gamma curve set in advance by a host computer.

A buffer RAM 210 is a RAM for temporarily storing image data to cause actual reading operation and communication with the host computer to synchronize with each other. A packing/buffer RAM control circuit 211 executes a process for executing a packing process of the read image data in accordance with an image output mode (binary, 4-bit multi-valued, 8-bit multi-valued, and 24-bit multi-valued) set in advance by the host computer, and writing the processed data in the buffer RAM 210, and a process for reading out the read image data written in the buffer RAM 210 and supplying the readout data to an interface circuit 212.

The interface circuit 212 performs reception of control signals and output processing of image signals from/to an external apparatus as the host apparatus of a document image reading apparatus according to the embodiment, such as a personal computer.

The CPU 215 is one in the form of, e.g., a microcomputer and has a ROM 215A that stores process procedures, and a working RAM 215B. The CPU 215 controls the respective units in accordance with the procedures stored in the ROM 215A.

Reference numeral 216 denotes, e.g., an quartz oscillator; and 214, a timing signal generation circuit which generates various timing signals by frequency-dividing an output from the quartz oscillator 216 in accordance with the settings by the CPU 215. An external apparatus 213 is connected to the packing/buffer RAM control circuit 211 through the interface circuit 212 and includes a personal computer or the like as an example.

According to the above embodiment, superposition of digital signal noise on an analog signal can be avoided, thereby realizing an image sensing apparatus capable of outputting a high-quality image signal.

Additionally, according to the above embodiment, a reliable document image reading apparatus including an image sensing apparatus with the above arrangement can be realized.

As many apparently widely different embodiments of the present invention can be made without departing from the spirit and scope thereof, it is to be understood that the invention is not limited to the specific embodiments thereof except as defined in the appended claims.

What is claimed is:

1. An image sensing apparatus comprising a multi-layered substrate in which a photoelectric conversion chip and a wiring pattern of a digital signal which drives the photoelectric conversion chip are wired on a single substrate layer, wherein a wiring pattern of an analog signal which includes image information output from the photoelectric conversion chip and the wiring pattern of the digital signal which drives the photoelectric conversion chip are formed on separate substrate layers.

2. An image sensing apparatus comprising a multi-layered substrate in which a photoelectric conversion chip and a wiring pattern of a digital signal which drives the photoelectric conversion chip are wired on a single substrate layer, wherein a wiring pattern of an analog signal which includes image information output from the photoelectric conversion chip and the wiring pattern of the digital signal which drives the photoelectric conversion chip are formed on separate substrate layers so as not to vertically contact each other.

3. An image sensing apparatus comprising a multi-layered substrate in which a photoelectric conversion chip and a wiring pattern of a digital signal which drives the photoelectric conversion chip are wired on a single substrate layer, wherein a width of a wiring pattern of an analog signal which includes image information output from the photoelectric conversion chip is not less than a width of the wiring pattern of the digital signal which drives the photoelectric conversion chip.

4. An image sensing apparatus comprising a multi layered substrate in which a photoelectric conversion chip and a wiring pattern of a digital signal which drives the photoelectric conversion chip are wired on a single substrate layer,
wherein a wiring pattern of an analog signal which includes image information output from the photoelectric conversion chip and the wiring pattern of the digital signal which drives the photoelectric conversion chip are wired on a single substrate layer, and
wherein a distance between the wiring pattern of the analog signal and the wiring pattern of the digital signal in which a ground wiring line is formed, is at least not less than a width of the wiring pattern of the digital signal.

5. An image sensing apparatus comprising a multi-layered substrate in which photoelectric conversion chips and a wiring pattern of a digital signal which drives the photoelectric conversion chip are wired on a single substrate layer, the multi-layered substrate having a plurality of analog output signal stages, the number of which is not more than a number of the photoelectric conversion chips and being arranged to output an output signal from the photoelectric conversion chip to an outside of the image sensing apparatus through the plurality of analog output stages,
wherein an analog output circuit is provided for each analog output stage, and each analog output circuit is comprised of one element.

6. An image sensing apparatus comprising a multi layered substrate in which a photoelectric conversion chip, a first wiring pattern of a digital signal which drives the photoelectric conversion chip, and a second wiring pattern of a driving signal which drives an LED light source for reading are wired on a single substrate layer,
wherein each of the first wiring pattern and a third wiring pattern of an analog signal which includes image information output from the photoelectric conversion chip is formed to have one or more wiring states out of:
(1) a wiring state in which the first wiring pattern and third wiring pattern are formed on separate layers;
(2) a wiring state in which the first wiring pattern and third wiring pattern are formed on a single layer, and a distance between the first and third wiring patterns in which a around wiring line is formed is at least equal to or more than a width of the second wiring pattern; and
(3) a wiring state in which a high-frequency removal device is inserted at a ground portion of a driving signal which drives the LED light source, and
the second wiring pattern is electrically separated from the first and third wiring patterns.

7. The apparatus according to claim 1, wherein the apparatus is driven by a high-frequency power supply of not less than 5 MHz.

8. A reading apparatus which reads a document image, comprising:
an image sensing apparatus defined in claim 1;
a document convey device disposed before and after the image sensing apparatus to position the document;
a contact device which makes the document contact the image sensing device; and
a control device which processes an output signal from the image sensing device to perform device control.

* * * * *